United States Patent [19]

Komeda et al.

[11] 4,204,894
[45] May 27, 1980

[54] PROCESS FOR FABRICATION OF SEMICONDUCTORS UTILIZING SELECTIVELY ETCHABLE DIFFUSION SOURCES IN COMBINATION WITH MELT-FLOW TECHNIQUES

[75] Inventors: Tadao Komeda, Yamatotakada; Kazufumi Ogawa, Neyagawa, both of Japan

[73] Assignee: Matsushita Electric Industrial Co., Ltd., Osaka, Japan

[21] Appl. No.: 35,236

[22] Filed: May 2, 1979

[30] Foreign Application Priority Data

Nov. 5, 1978 [JP] Japan .................................. 53/56303

[51] Int. Cl.² .................. H01L 21/225; H01L 21/316
[52] U.S. Cl. ...................................... 148/188; 29/571; 29/578; 148/187; 148/190; 156/653; 156/657; 156/662; 357/23; 357/54
[58] Field of Search ....................... 148/187, 188, 190; 156/653, 657, 662; 357/23, 54; 29/571, 578

[56] References Cited

U.S. PATENT DOCUMENTS

| | | | |
|---|---|---|---|
| 3,825,442 | 7/1974 | Moore | 148/187 X |
| 3,986,896 | 10/1976 | Veno et al. | 148/188 X |
| 3,986,903 | 10/1976 | Watrous | 148/190 X |
| 4,079,504 | 3/1978 | Kosa | 148/187 X |
| 4,102,733 | 7/1978 | De La Moneda et al. | 357/23 X |
| 4,114,256 | 9/1978 | Thibault et al. | 29/571 |
| 4,151,631 | 5/1979 | Klein | 29/571 |

Primary Examiner—L. Dewayne Rutledge
Assistant Examiner—W. G. Saba
Attorney, Agent, or Firm—Burgess, Ryan and Wayne

[57] ABSTRACT

A process for fabrication of semiconductor devices comprising the steps of depositing over the surface of a semiconductor wafer a first insulating layer containing impurities which are to be diffused into the wafer so as to form source and drain regions, depositing a second insulating and melt-flow layer which is softened or melted at low temperatures, opening contact windows, forming a third insulating layer which also contains impurities to be diffused into the wafer so as to form source drain regions, subjecting the wafer to a heat treatment so as to cause melt-flow and form source and drain regions by the diffusion and removing the third insulating layer. LSI circuits with a high source-drain breakdown voltage may be fabricated at high yields.

17 Claims, 14 Drawing Figures

(SCANNING ELECTRON MICROSCOPE SEM)

A

B

PROCESS FOR FABRICATION OF SEMICONDUCTORS UTILIZING SELECTIVELY ETCHABLE DIFFUSION SOURCES IN COMBINATION WITH MELT-FLOW TECHNIQUES

BACKGROUND OF THE INVENTION

The present invention relates to semiconductor devices and process for fabrication of the same and has for its object to provide a process for fabrication of semiconductor devices which includes a melt-flow step for forming a SiO$_2$ layer (PSG layer) containing phosphor over the surface of a semiconductor device (such as MOSLSI) and subjecting the wafer to a heat treatment so as to obtain the flat and smooth surface and which may attain high yields in the fabrication of semiconductor devices with a high source-drain breakdown voltage and a minimal leakage current.

The melt-flow process has been proposed so as to avoid mechanical damage to aluminum metallized patterns. For instance, over the surface of a p-type wafer are formed a SiO$_2$ layer of a thickness of about 0.8 micrometer, a source region, a drain region, a SiO$_2$ gate film, a polysilicon gate layer and a polysilicon interconnection pattern film. Thereafter a SiO$_2$ (PSG) layer containing phosphorus is deposited to a thickness of about 1.5 micrometer, and source, drain and gate contact windows are opened. Next the wafer is subjected to a heat treatment at about 1000° C. for 30 minutes in an atmosphere of wet oxygen so that the SiO$_2$ layers may be fluidized or melted and a layer may be deposited by thermal oxidation to a thickness of about 0.2 micrometer over the exposed surfaces of the source and drain regions and the surface of the polysilicon gate. Thereafter the wafer is placed in an etchant containing HF so as to remove the thermally oxidized films in the cntact windows and then an aluminum interconnection pattern film is deposited.

The prior art process for the fabrication of semiconductors of the type described has however some problems. That is, in the step of removing the thermally oxidized film, the etchant attacks the SiO$_2$ (PSG) layer containing phosphorus five to 10 times as fast as it does the thermally oxidized layer so that the SiO$_2$ (PSG) layer becomes too thin. As a consequence, pin holes are produced, and short-circuits occur between the polysilicon layer and the aluminum layer.

SUMMARY OF THE INVENTION

One of the objects of the present invention is to provide a process for fabrication of semiconductor devices which may yield LSI circuits with flat and smooth surfaces and with no pin holes.

Another object of the present invention is to provide a process for fabrication of semiconductor devices which may easily fabricate such semiconductor devices that the contact regions which are made into contact with the aluminum layer have a deep diffusion depth while the diffusion regions immediately below the gate have a shallow diffusion depth.

A further object of the present invention is to provide a process for fabrication of semiconductor devices which may minimize the leakage current flowing across the p-n junction and may increase a source-drain breakdown voltage.

According to the present invention, a p- or n-type semiconductor wafer or substrate is prepared, and a first insulating layer containing n- or p-type impurities and a second insulating layer which may be fluidized or melted at relatively low tempertures are deposited over one major surface of the wafer in the order named. Thereafter contact windows are opened, and a third insulating film containing n- or p-type impurities is deposited over the wafer. Next the wafer is heat treated so that the second insulating layer may be melted while the n- or p-type impurities may be diffused into the wafer from the first and third insulating layers. The n- or p-type region formed by the diffusion of the impurities from the third insulating film is deeper in diffusion depth than the region formed by the diffusion of the impurities from the first insulating layer. In the final step, the third insulating layer is removed so as to open the contact windows again.

DESCRIPTION OF THE PREFERRED EMBODIMENTS

Figure 1:
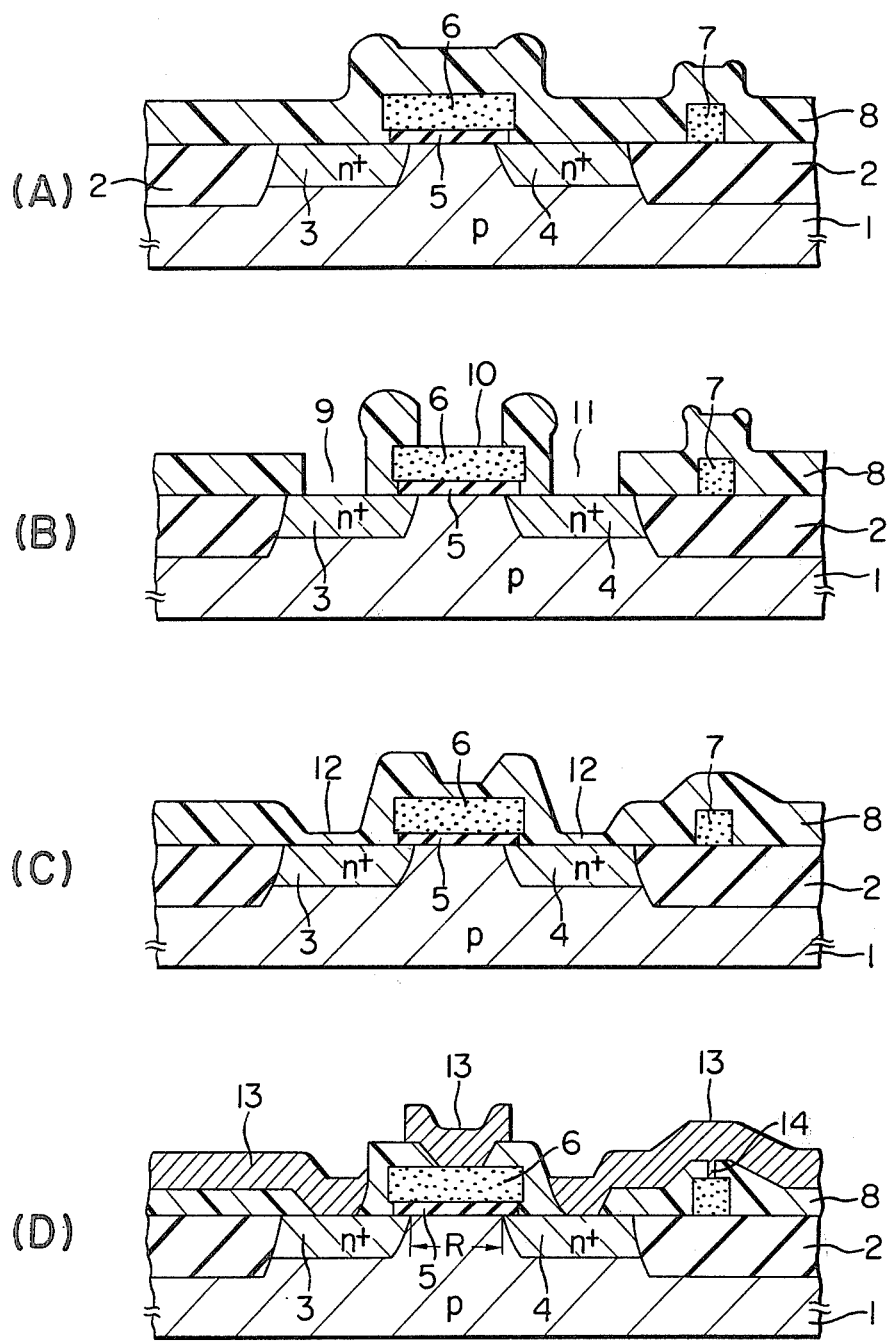
FIGS. 1(A)–(D) are schematic sectional views, on enlarged scale, used for the explanation of the steps of a prior art process for fabrication of semiconductor devices.

Prior Art, FIG. 1

Prior to the description of the preferred embodiments of the present invention, a prior art melt-flow process will be briefly described with reference to FIG. 1. Over the surface of p-type substrate 1 are formed a SiO$_2$ layer 2 of a thickness of about 0.8 micrometer, a source region 3, a drain region 4, a gate orSiO$_2$ layer 5, a polycrystalline silicon layer 6 for the gate electrode and a polycrystalline silicon layer 7 for connection. Over these elements is formed a layer of silicon oxide SiO$_2$ containing phosphorus to a thickness of about 1.5 micrometer. (See FIG. 1A).

Thereafter as shown in FIG. 1(B), a source contact window 9, a gate contact window 10 and a drain contact window 11 are opened. Therefter the wafer is subjected to a heat treatment at about 1000° C. for 30 minutes in an atmosphere of wet oxygen. Then the PSG layer 8 is fluidized, and the source and drain regions 3 and 4 (which have been exposed when the contact windows 9 and 10 were opened) are formed and the polysilicon electrodes are formed with thermally oxidized layers 12 to a thickness of about 0.2 micrometers as shown at (C). Thereafter the wafer is placed in a solution or etchant containing HF and capable of removing the $SiO_2$ layers so as to remove the thermally oxidized layer 12 in the contact windows 9, 10 and 11. Thereafter a layer of aluminum 13 is deposited and patterned as shown in FIG. 1(D). Thus the MOSLSI is fabricated.

In the step of removing the thermally oxidized layer 12, the etchant attacks the PSG layer 8 five to ten times as fast as it attacks the thermally oxidized layer 12. As a result the PSG layer 8 becomes so thin that pin holes appear, thus causing the short-circuit between the polysilicon film 7 and the aluminum conductor 13 and consequently resulting in low yields.

There has also been known a process wherein after the heat treatment in an atmosphere of wet oxygen (FIG. 1(C)), the contact windows are opened again by the photolithographic or masking process. However this process requires one more step, and furthermore in the case of a mask with an extremely fine pattern, it becomes extremely difficult to attain the correct alignment between the mask and the wafer and the etching of the $SiO_2$ layer, thus resulting in low yields.

In addition, in the step of aluminum sintering, the diffusion depths in the source and drain 3 and 4 must be in excess of one micrometer so that even when aluminum is alloyed and introduced into the source and drain regions, leakage current across the p-n junction may be minimized. Then the result is the increase in the thickness of the n+ diffused region immediately below the gate so that the gate length R is reduced and consequently the source-drain breakdown voltage is decreased.

The Invention, FIGS. 2–6

One preferred embodiment of the present invention will be now described below in conjunction with the fabrication of a MOS transistor in a MOSLSI. First as shown in FIG. 2(A), over the surface of a p-type silicon substrate 20 are formed a $SiO_2$ layer 21 of a thickness of about 0.8 micrometer, a $SiO_2$ gate film 24 of a thickness of about 0.1 micrometer, a polysilicon gate electrode 25 of a thickness of about 0.3 micrometer and a polysilicon connection layer 26. The surface of the silicon wafer 20 is partly left exposed so as to form source and drain regions.

In the next step shown in FIG. 2(B), over the silicon wafer 20 with the above pattern is formed as a first insulating layer a $SiO_2$ layer 40 to a thickness of from 0.05 to 0.2 micrometer. The first $SiO_2$ layer which contains a dopant such as arsenic or antimony with a low diffusion constant may be deposited by introducing the oxygen $O_2$ gas and $AsH_3$ gas or $SbH_3$ gas and $SiH_4$ gas over the surface of the silicon wafer 20 which is heated to 350–450° C. Alternatively the spin-on process may be employed. That is a drop of a solution containing silicon compounds together with arsenic or antimony compounds (which is available in the market under the tradename of Areseno Silicafilm or Antimony Silicafilm) is placed over the surface of the silicon wafer 20, and the wafer 20 is spun.

Over the first insulating layer 40 is formed a second insulating layer or a melt-flow layer 41 to a thickness of from 0.3 to 1.0 micrometer. The PSG melt-flow layer 41 which is softened at a relatively low temperature and contains 3–10 molecular percent of $P_2O_5$ may be deposited by means of chemical vapor deposition of for instance a gas mixture consisting of $O_2$ and $PH_3$ and $SiH_4$. Alternatively the second insulating or melt-flow layer 41 may be a lead glass layer containing Pb. (In the following description, the second insulating layer or melt-flow layer 41 refers to PSG layer.)

In the next step shown in FIG. 2(C), a source contact window 39, a gate contact window 39 and a drain contact window 39 are opened by the photoetching technology. Thereafter a third insulating PSG layer 42 containing 10–20 molecular percent $P_2O_5$ is formed to a thickness of from 0.01 to 0.5 micrometer.

Next as shown in FIG. 2(D), the wafer is subjected to a heat treatment at 1000°–1200° C. in an atmosphere of nitrogen, oxygen or wet oxygen. Then the PSG layers 41 and 42 are fluidized or softened so that the steep slopes between the steps and bumps may be decreased. Since the PSG layer 42 is greater in thickness than the layer 41, the results of melt-flow are in a large part attributable to the fluidization or softening of the PSG layer 41. In addition, n+ source and drain regions 43 and 43' are formed to the diffusion depths from 0.1 to 0.5 micrometer immediately below the $SiO_2$ layers 40 which contains arsenic or antimony. Since the PSG layer 42 contains a high concentration of phosphorus, n+-type source and drain contact regions 44 and 44' are formed immediately below the PSG layer 42 to the diffusion depths of from 0.5 to 2 micrometer which are deeper than the source and drain regions 43 and 43'.

According to the results of extensive studies and experiments conducted by the inventors, it was found out that the presence of the PSG layer 42 in each contact window 39 much enhances the fluidization or melting and flowing of the PSG layer 41 within the contact window 39. A possible but not yet proved explanation is that according to the prior art process described elsewhere with reference to FIG. 1 the melt-flow layer 8 is made into contact with the silicon wafer 1 and will not fit with the wafer 1 so that fluidization or melt-flow is retarded. On the other hand, according to the process of the present invention, both the melt-flow PSG layer 41 and the contact diffusion layer 42 contain $SiO_2$ so that they may act very intimately and consequently the fluidization or melt-flow may be enhanced.

In summary, according to the present invention, even at a low heat-treatment temperature and with a low concentration of phosphorus in the PSG layer 41, the fluidization or melt-flow may be much facilitated so that the steep slopes between the steps and bumps created on the surface of the silicon wafer by the preceding photolithographic steps may be remarkably decreased.

Figure 5:
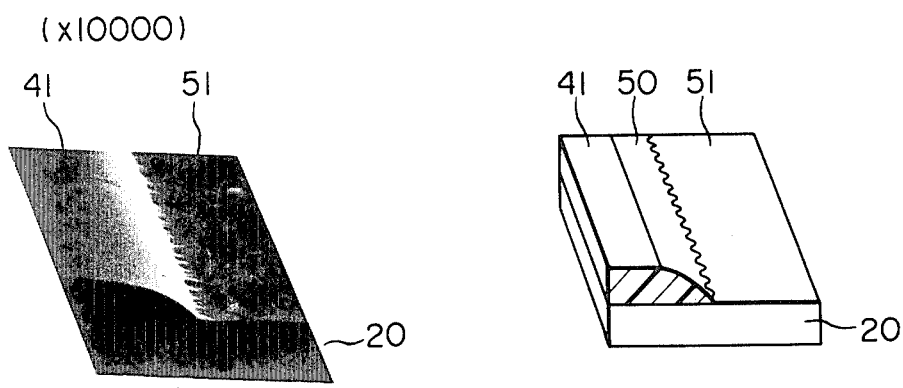
FIG. 5A is a perspective view of a contact window after the melt-flow step without the deposition of a third insulating film 42 shown in FIG. 2.
FIG. 5B is a perspective view of a contact window after the melt-flow step with a third insulating film 43 deposited.
Figure 5:
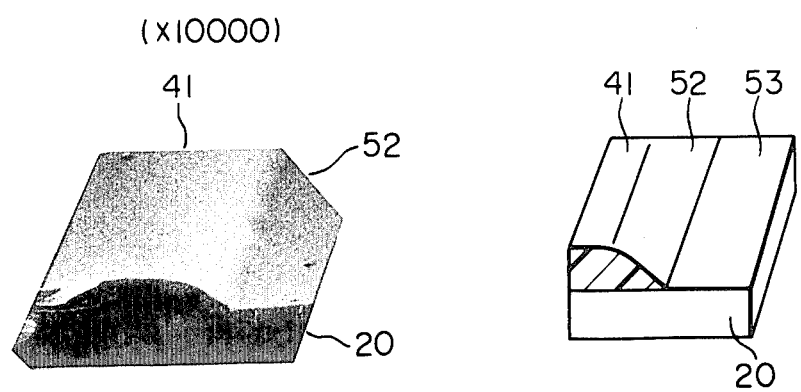

Next referring particularly to FIG. 5, the removal of the PSG layer 42 will be described. As shown in FIG. 5B, after the melt-flow step the contact window region 39 has a smooth side face. If the melt-flow step is carried out without forming the PSG layer 42 so as to form the contact window, the low edge 51 of the side face 50 of the contact window is extremely rough or zig-zaged, but when the melt-flow step is carried out after the formation of the PSG layer 42 in accordance with the present invention the edge 53 of the side face 52 of the contact window is straight and smooth as shown in FIG. 5B.

When another layer or film is deposited on the wafer 20 shown in FIG. 5A, the deposited film would have also a rough surface and crackings would propagate through the film, which would greatly affect adversely the formation of the photoconductive layer to be described below.

Referring back to FIG. 2(E), after the removal of the PSG layers so as to open the contact windows, aluminum conductor patterns 45, 46 and 47 for a MOS transistor are deposited.

In the MOS transistor fabrication steps described so far, the diffusion depths of the n+-type regions 43, 43', 44 and 44' are dependent upon the concentration of arsenic or antimony in the SiO2 layer and the melt-flow heat-treatment time and temperature. The higher the concentration of phosphorus in the PSG layer 42 as compared with the phosphorus concentration in the PSG layer 41, the faster the etchant attacks the PSG layer 42 than it does the PSG layer 41 in the step E for removal of the layer 42 so that the PSG layer 41 will not be attacked or etched.

In summary, according to the present invention, the shallow and deep source and drain regions 43 and 44 and 43' and 44' may be formed simultaneously with a higher degree of accuracy. The widths of the shallow regions 43 and 43' are determined simultaneously when the contact windows are opened. As a result, the fabrication steps may be much simplified and controlled with a higher degree of accuracy. Furthermore, after the melt-flow step, with the use of a mixture of NH4F and HF the thin PSG layer 42 containing phosphorus in high concentration may be removed from the contact windows. When the etching is stopped when the wafer 20 is exposed, the etchant will hardly attack the PSG layer 41 so that no pin holes will appear and consequently the short-circuits between the aluminum conductors 45, 46 and 47 and the polysilicon layer 26 may be avoided. Thus large-scale integration circuits may be fabricated with a high yield.

More specifically, according to the present invention, the contact windows 39 are coated with the PSG layer 42 during the melt-flow step in the oxygen or oxidizing or wet oxygen atmosphere so that no thermally oxidized layers will be deposited in the contact windows 39. As a result, the contact windows may be opened correctly both in pattern and position merely by removing the PSG layer 42. In addition, as described elsewhere the contents of phosphorus is higher in the PSG layer 42 than the PSG layer 41 so that the PSG layer 42 may be etched with a high etching rate and no pin hole will appear in the PSG layer 41 in the step of removing the PSG layer 42.

Moreover according to the present invention both the melt-flow step and the step for forming the source and drain regions may be effected simultaneously. Furthermore the step for forming the shallow and deep regions may be effected simultaneously. Therefore the fabrication steps may be remarkably simplified, and the source and drain regions may be formed with a higher degree of controllability.

According to the present invention, the source and drain regions 43 and 43' are formed by the diffusion of dopant atoms from the SiO2 layer 40 containing dopant atoms with a low diffusion constant. Therefore the results are that the diffusion depths of the source and drain regions 43 and 43' are shallow; the gate length will not become too short; no concentration of the electric field will occur even at a shallow p-n junction so that MOS transistors with a high source-drain breakdown voltage may be fabricated. Since the deep regions 44 and 44' are formed, the aluminum conductors 45, 46 and 47 cannot make contact with the p-n junction in the contact region so that even at a high aluminum sintering temperature employed in the step for patterning the aluminum conductors 45, 46 and 47, no leakage current across the p-n junction will occur due to the penetration or "punch-through" of aluminum.

Figure 2:
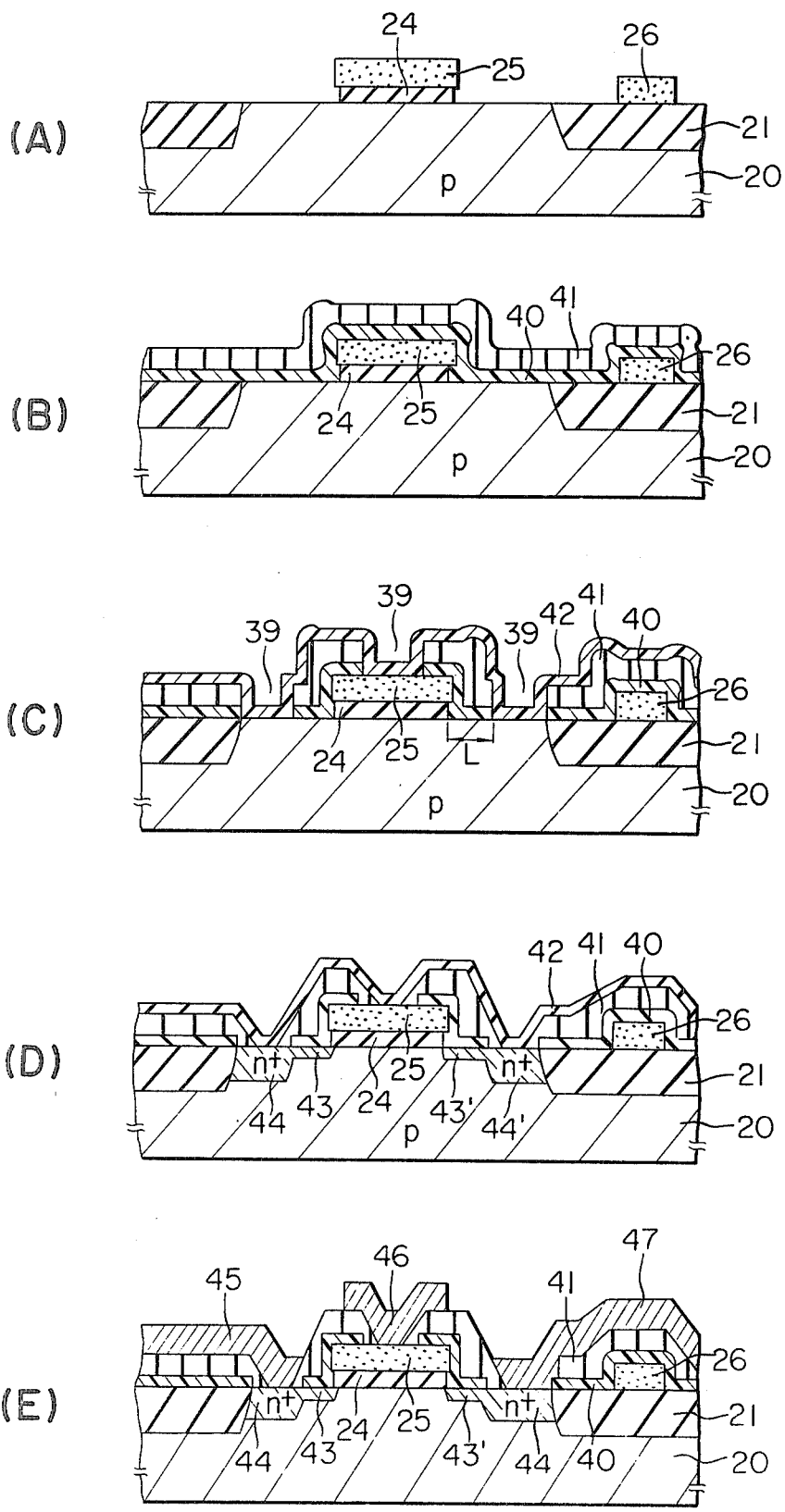
FIGS. 2(A)–(E) are schematic sectional views, on exaggerated scale, of the sequential steps of one embodiment of a process for fabrication of semiconductor devices in accordance with the present invention.

In the step shown at (B) in FIG. 2, instead of the SiO2 layer 40 which contains antimony, a PSG layer may be deposited whose phosphorus concentration is lower than that of the SiO2 layer 43. Then the difference in depth between the shallow regions 43 and 43' and deep regions 44 and 44' may be remarkably enhanced due to the difference in phosphorus concentration in the melt-flow step (D). More specifically, the n-type regions 43 and 43' are formed immediately below the PSG layer 40 having a low phosphorus concentration to a diffusion depth of form 0.5 to 1.0 micrometer while the n+-type regions 44 and 44' are formed immediatley below the PSG layer 42 with a high phosphorus concentration to a diffusion depth of from 1 to 2 micrometer.

According to the present invention, the PSG layers 40 and 41 may be formed by means of chemical-vapor deposition process or thermal decomposition process of SiH4 and PH3. That is, PH3 at a low concentration is introduced over the surface of the wafer so as to deposit the PSG layer 40, and then PH3 at a high concentration is introduced so as to deposite the PSG film 41. Thus the PSG layers 40 and 41 are formed successively in the same step. After the formation of the contact windows, the PSG film 42 may be formed in a similar manner. The PSG film formation step may be more simplified by progressively increasing the concentration of the chemical vapor.

In the step for removing the PSG film 42, the etchant attacks the PSG film 42 faster than it does the PSG film 41 so that the occurrence of pin holes due to the etching of the PSG layer 41 may be more positively avoided.

According to the present invention the SiO2 film 40 contains arsenic or antimony with a low diffusion constant so that even at a high melt-flow step or fluidization temperature and a for a relatively long melt-flow step, the diffusion depths of the n+ regions 43 and 43' are short. Therefore even with the PSG film 41 with a phosphorus concentration, the satisfactory melt-flow effects may be attained. Furthermore the resistance to humidity of the PSG film 41 may be considerably improved.

According to one aspect of the present invention, the length L [See FIG. 2(C)] may be defined simultaneous with the opening of the contact windows. That is, the length L may be minimized so that the curvature of the depletion region in the proximity of the drain region 43' may be increased due to the effects of the depletion region of the deep drain region 44'. As a consequence, a higher source-drain breakdown voltage may be obtained.

Figure 3:
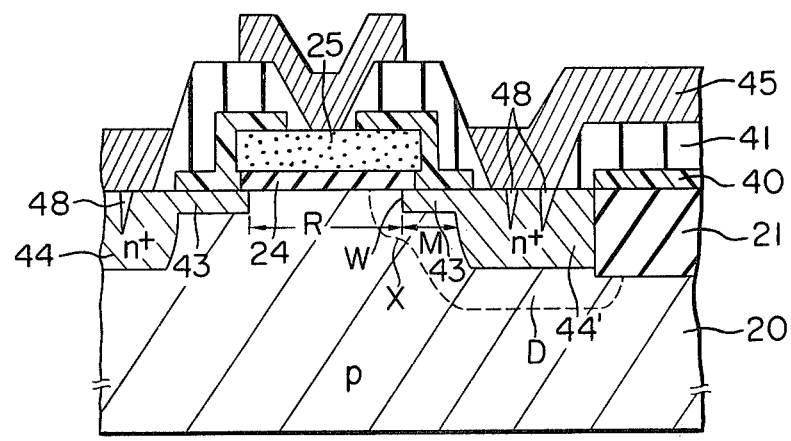
FIG. 3 is a schematic sectional view, on further enlarged scale, of a MOSLSI fabricated by the process of the present invention, a voltage being applied between the source and drain.

Next referring to FIG. 3, the depletion region or layer in the vicinity of the drain of the MOS transistor fabricated in accordance with the present invention will be described. As a voltage is applied between the source and drain, the depletion layer D is extended around the drain regions 43' and 44'. The diffusion depth of the n+-type region 43' is shallow and even when the radius of curvature of the edge W of the diffused region 43' is small, the length M of the n+-type region 43' can be made as short as from 1 to 3 micrometer so that the depletion layer in the vicinity of the edge W is influenced by the depletion region in the vicinity of the n+-type region 44'. That is, the radius of curvature of the depletion region D is greater so that the radius X of curvature of the depletion layer in the vicinity of the edge W becomes greater than when only the n+-type region is formed. As a result, no electric field concentration will occur so that the breakdown voltage between the source and drain as well as the breakdown voltge between the drain and the substrate may be increased.

Figure 4:
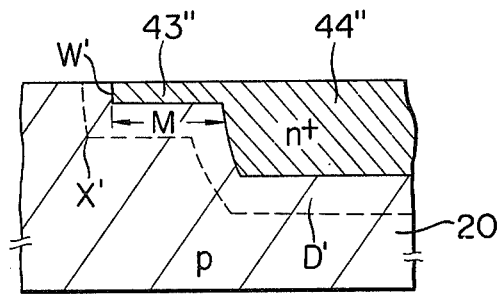
FIG. 4 is a schematic sectional view, on enlarged scale, of a MOSLSI with a low-source-drain breakdown voltage, a voltage being applied between the source and drain.

Referring to FIG. 4, when the n+-type region 43″ has a long length M′, the depletion region D′ will not affect the edge W′ of the region 43″. As a result, the radius X′ of curvature of the depletion region D′ in the vicinity of the edge W′ of the region 43″ becomes substantially equal of the radius of curvature attained when only the n+-type diffused region 43″ exists alone. Thus the electric field concentration results so that the breakdown voltage between the source and drain as well as the breakdown voltage between the drain and wafer decreases.

Referring back to FIG. 3, the length M of the region 43′ is determined depending upon the length L between the gate layer 24 and the edge of the contact window 39 which in turn is determined in the step C in FIG. 2, as well as the diffusion depth of the n+-type region 44. Therefore the length L is so selected that the radius X of curvature as described above may be obtained. Since the diffusion depths of the drain and source regions 43′ and 43 are shallow, the distance R between the source and drain may be prevented from being too shortened. Thus the punch-through voltage between the source and drain may be increased. On the other hand, the n+-type regions 44 and 44′ which are made into contact with the aluminum conductors 45, 47 may have deep diffusion depths so that Al-Si alloys 48 which are produced in the aluminium sintering step will not break the p-n junction and consequently no leakage current will flow across the p-n junction.

Figure 6:
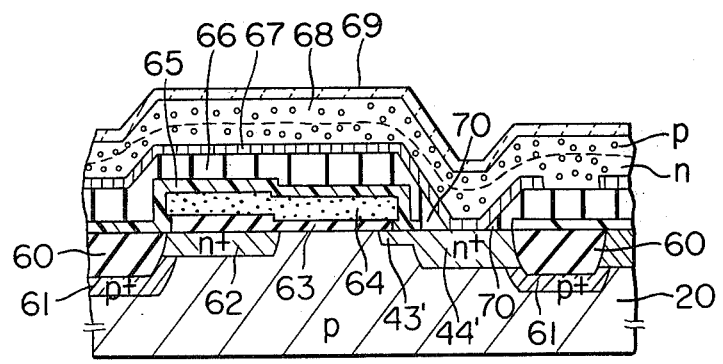
FIG. 6 is a fragmentary sectional view of cell units of a solid-state image pickup device fabricated by the process in accordance with the present invention.

As will be described below with particular reference to FIG. 6, the present invention may deposit a layer or layers uniformly over the surface of a wafer. FIG. 6 shows a unit cell of a solid-state image pickup device wherein a photosensor of compound semiconductors is formed over a charge-transfer device such as BBD. That is, over the surface of a p-type silicon wafer 20 is formed a BBD unit or element consisting of a field SiO₂ film (SiO₂ field film) 60 of a thickness of about 0.7 micrometer, a p+-typechannel step region 61, an n+-type diffused region 62, a gate oxide 63, a polysilicon electrode 64, and n+-type drain regions 43′ and 44′. Thereafter a first PSG film 65 which corresponds to the first insulation layer 40 shown in FIG. 2 and contains 3-10 molecular percent of P₂O₅ is deposited, and then a second PSG film 66 which corresponds to the layer 41 shown in FIG. 2 and contains 3-18 molecular percent of P₂O₅ is deposited over the first PSG film 65. After a contact window is opened a third insulating PSG film (not shown) which corresponds to the layer 42 shown in FIG. 2 and contains 10-20 molecular percent of P₂O₅ is deposited. The wafer is subjected to the melt-flow step at 1100° C. in an atmosphere of nitrogen. Thereafter the third insulating PSG film is removed so as to expose the silicon surface in the contact window. Thereafter a Mo film 67 is deposited to a thickness of about 0.1 micrometer by means of vacuum evaporation so as to pattern the arrays of image cell units. Thereafter a photoconductive layer 68 of for instance ZnSe (n-type) ZnCdTe (p-type) structures is deposited or otherwise formed over the film 67, and a transparent electrode 69 is deposited or otherwise formed over the film 68.

Therefore the image cell unit shown in FIG. 6 is so structurally arranged that a first light receptor consisting of the p-n junction between the wafer 20 and the region 44′ is connected through the Mo electrode 67 to a second light receptor consisting of the photoconductive film 68. Because of the cumulative effects of both the first and second light receptors, the solid-state image pickup device shown in FIG. 6 has an extremely high sensitivity more than a few times as high as the sensitivity obtainable when only the first light receptors are provided. Because of the functional properties of the solid-state image pickup device, the surface of the photoconductive film 68 must be smoothed as practically as possible; that is, the steps and bumps must be minimized.

That is, the steep steps and deep bumps will inevitably result the degradation of the characteristics of the photoconductive film 68 deposited over them. Therefore when a voltage is applied between the transparent electrode 69 and the Mo film 67, leakage current flows so that the photoconductive characteristics are adversely affected.

However, when the PSG films in the BBD element are subjected to the melt-flow step in accordance with the present invention, the steps and bumps created over the surface of the wafer 20 by the preceding fabrication steps may be satisfactorily decreased so that the uniform deposition of the Mo electrode 67 and the photoconductive film 68 may become possible. It is to be emphasized that the edge of the side face 70 of the contact window is straight and smooth as shown in FIG. 5B. As a consequence, the degradation of the functional characteristics of the photoconductive film 68 may be avoided, and the solid-state image pickup device exhibits the functional characteristics substantially equal to those attainable when the photoconductive layer is deposited over a flat and smooth surface of a wafer.

When the wafer 20 has the steep steps and deep bumps over its surface, cracks are propagated in the photoconductive film 68 deposited over it and local breakdowns of the p-n junction occur. Then when a voltage is applied between the Mo film 67 and the transparent electrode 69, a leakage current flows between them with the resultant degradation of photoconductive characteristics. However, as described above, when the melt-flow step of the present invention is employed so as to obtain as practicably flat and smooth surface, no crack will occur in the photoconductive film deposited over it.

It is understood that in addition to the BBD element shown in FIG. 6, the present invention may be equally applied to the fabrication of other types of solid-state image pickup devices such as MOS type.

In sum, according to the present invention there may be provided for the fabrication of MOS large-scale integration circuits a surface flattening and smoothing step by means of the melt-flow process may be provided which may be controlled with an extremely higher degree of accuracy hitherto unattainable by the prior art fabrication processes.

What is claimed is:

1. A process for fabricating semiconductor devices characterized by the steps of
   forming a first insulating layer containing n- or p-type impurities over the surface of a p- or n-type semiconductor wafer,
   forming a second insulating layer over said first insulating layer, said second insulating layer being softened or meltable at low temperatures, selectively removing portions of said first and second insulating layers so as to selectively expose said semi-conductor wafer, forming a third insulating layer containing n- or p-type impurities over the surface of said semiconductor wafer including its exposed areas, said third layer being selectively etchable from said second layer, heating said wafer so as to fluidize or soften or melt said second insulating layer while diffusing said n- or p-type impurities from said first and third insulating layers into said semiconductor wafer, and removing said third insulating layer by selective etching.

2. A process for fabricating semiconductor devices as set forth in claim 1 further characterized by
using as the impurities doped into said first insulating layer the impurities having a smaller diffusion constant than those doped in said third insulating layer.

3. A process for fabricating semiconductor devices as set forth in claim 1 further characterized in that
said third insulating layer has a higher dopant concentration than said first insulating layer.

4. A process for fabricating semiconductor devices as set forth in claim 1 further characterized in that said second insulating layer has n- or p-type impurities.

5. A process for fabricating semiconductor devices as set forth in claim 1 further characterized in that
said second insulating layer contains n- or p-type impurities, and
said third insulating layer is higher in dopant concentration than said second insulating layer.

6. A process for fabricating semiconductor devices as set forth in claim 1 further characterized in that
said second insulating layer contains n- or p-type impurities and the dopant concentration is progressively increased in the order of said first, second and third insulating layers.

7. A process for fabricating semiconductor devices as set forth in claim 1 further characterized in that
after the removal of said third insulating layer, a molybdenum pattern layer is formed and then a photoconductive layer is formed on said semiconductor wafer, thereby providing a solid-state image pickup cell unit.

8. A process for fabricating semiconductor devices as set forth in claim 7 further characterized in that
said photoconductive layer consists of ZnSe-ZnCdTe.

9. A process for fabricating semiconductor devices characterized by the steps of
forming a first insulating layer containing n- or p-type impurities over the surface of a p- or n-type semiconductor wafer,
forming a second insulating layer over said first insulating layer, said second insulating layer being softened or melted at low temperatures,
selectively removing portions of said first and second insulating layers so as to selectively expose said semiconductor wafer, forming a third insulating layer containing n- or p-type impurities over said semiconductor wafer including its exposed areas, said third layer being selectively etchable from said second layer, heating said semiconductor wafer so that said second insulating layer is softened or melted while the n- or p-type impurities are diffused from said first and third insulating layers into said semiconductor wafer, thereby selectively forming a first n- or p-type region within said semiconductor wafer by the diffusion of the impurities from said first insulating layer while forming a second region within said semiconductor wafer by the diffusion of said impurities from said third insulating layer, said second region being adjoined to said first region and being deeper in diffusion depth than said first region, and removing said third insulating layer by selective etching.

10. A process for fabricating semiconductor devices as set forth in claim 9 further characterized in that said first and second regions are so formed that when a p-n junction between said semiconductor wafer and said first and second regions is reverse biased (NOT reversely biased) the radius of curvature of a depletion layer in the vicinity of said second region may become greater than that of a depletion layer which would appear when only said second region was formed.

11. A process for fabricating semiconductor devices as set forth in claim 9 further characterized in that said first and second regions are used as a drain region of a polysilicon gate MOS field-effect transistor.

12. A process for fabricating semiconductor devices as set forth in claim 9 further characterized in that said second insulating layer contains n- or p-type impurities.

13. A process for fabricating semiconductor devices as set forth in claim 9 further characterized in that said second insulating layer contains n- or p-type impurities, and said third insulating layer is higher in dopant concentration than said second insulating layer.

14. A process for fabricating semiconductor devices as set forth in claim 9 further characterized in that said second insulating layer contains n- or p-type impurities and the dopant concentration is progressively increased in the order of said first, second and third insulating layers.

15. A process for fabricating semiconductor devices as set forth in claim 9 further characterized in that the impurities doped in said first insulating layer have a smaller diffusion constant than those doped in said third insulating layer.

16. A process for fabricating semiconductor devices as set forth in claim 9 further characterized in that said third insulating layer is higher in dopant concentration than said first insulating layer.

17. A process for fabricating semiconductor devices as set forth in claim 9 further characterized in that after removal of said third insulating layer, a photoconductive layer is formed over the surface of said semiconductor wafer so as to provide a solid-state image pickup cell unit.

* * * * *

UNITED STATES PATENT OFFICE
CERTIFICATE OF CORRECTION

Patent No. 4,204,894      Dated May 27, 1980

Inventor(s) Tadao Komeda, et al

It is certified that error appears in the above-identified patent and that said Letters Patent are hereby corrected as shown below:

Column 1, line 38: "cntact" should be --contact--.

In the title page, under "Foreign Application Priority Data":
"Nov. 5, 1978" should be --May 11, 1978--.

Signed and Sealed this

Eleventh Day of November 1980

[SEAL]

Attest:

SIDNEY A. DIAMOND

Attesting Officer     Commissioner of Patents and Trademarks